United States Patent
Berchtold

(10) Patent No.: US 8,573,467 B2
(45) Date of Patent: Nov. 5, 2013

(54) METHOD FOR DISPENSING SOLDER ON A SUBSTRATE AND METHOD FOR MOUNTING SEMICONDUCTOR CHIPS

(75) Inventor: Heinrich Berchtold, Luzern (CH)

(73) Assignee: ESEC AG, Cham (CH)

( * ) Notice: Subject to any disclaimer, the term of this patent is extended or adjusted under 35 U.S.C. 154(b) by 0 days.

(21) Appl. No.: 13/474,683

(22) Filed: May 17, 2012

(65) Prior Publication Data

US 2012/0298730 A1    Nov. 29, 2012

(30) Foreign Application Priority Data

May 23, 2011 (CH) .......................... 873/11
Apr. 5, 2012 (CH) .......................... 479/12

(51) Int. Cl.
*B23K 20/00* (2006.01)
*B23K 20/10* (2006.01)
(52) U.S. Cl.
USPC ........... 228/110.1; 228/1.1; 228/111; 228/51; 228/52; 228/53; 228/54; 228/55
(58) Field of Classification Search
USPC .............................. 228/110.1, 1.1, 111, 51–55
See application file for complete search history.

(56) References Cited

U.S. PATENT DOCUMENTS

| | | | |
|---|---|---|---|
| 4,577,398 A | 3/1986 | Sliwa et al. | |
| 4,709,849 A | 12/1987 | Socolowski | |
| 5,878,939 A | 3/1999 | Luchinger et al. | |
| 6,056,184 A | 5/2000 | Luchinger et al. | |
| 2009/0145950 A1 | 6/2009 | Lam et al. | |

FOREIGN PATENT DOCUMENTS

| | | | |
|---|---|---|---|
| JP | 55-136562 | | 10/1980 |
| JP | 63215368 A | * | 9/1988 |
| JP | 2004-214354 | | 7/2004 |
| JP | 2004-322109 | | 11/2004 |
| WO | 00/62969 | | 10/2000 |
| WO | 2005/069370 | | 7/2005 |

* cited by examiner

*Primary Examiner* — Keith Walker
*Assistant Examiner* — Erin Saad
(74) *Attorney, Agent, or Firm* — Nixon Peabody LLP

(57) ABSTRACT

The invention relates to a method for dispensing solder and a method for mounting a semiconductor chip on the dispensed solder. The substrate is heated to a temperature which lies above the melting temperature of the solder and a solder portion is applied. A pin is thereafter immersed in the solder portion until it touches the solder portion and presses against the substrate. The pin is subjected to ultrasonic sound in such a way that ultrasonic waves are generated in the pin, which are directed perpendicularly or angularly in relation to the surface of the substrate, and is then moved along a predetermined path in order to distribute the solder. The treatment with ultrasonic sound locally improves the wettability of the substrate. The temperature of the pin is preferably lower than the melting temperature of the solder.

20 Claims, 2 Drawing Sheets

Figure 1A:
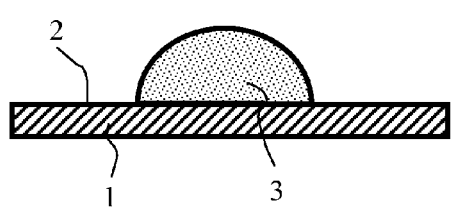
Figure 1B:
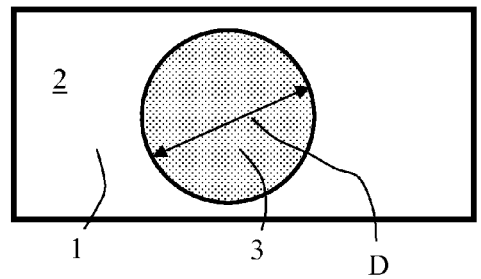

METHOD FOR DISPENSING SOLDER ON A SUBSTRATE AND METHOD FOR MOUNTING SEMICONDUCTOR CHIPS

PRIORITY CLAIM

Applicant hereby claims foreign priority under 35 U.S.C §119 from Swiss Application No. 873/11 filed May 23, 2011 and from Swiss Application No. 479/12 filed Apr. 5, 2012, the disclosures of which are herein incorporated by reference.

FIELD OF THE INVENTION

The invention relates to a method for dispensing solder on a substrate on the one hand and a method for mounting semiconductor chips on the dispensed solder on the other hand.

BACKGROUND OF THE INVENTION

Soldering methods of this kind are typically but not exclusively used in the mounting of semiconductor chips on a metallic substrate, a so-called leadframe. Power semiconductors are usually mainly connected by means of soft soldering with the substrate, which usually consists of copper, in order to ensure a more effective dissipation of the heat losses from the semiconductor chip via the soldered joint in comparison with mounting by means of an adhesive. High requirements are placed on the homogeneity of the soldered joint, especially in the case of increased power density, i.e. a defined thickness, even distribution and perfect wetting of the solder layer over the entire chip area as well as complete freedom from bubbles and purity of the soldered joint are demanded. On the other hand, the solder should not escape laterally from the soldering gap and spread next to the semiconductor chip, which again requires precise dosing and positioning of the solder portions.

In the field of mounting semiconductor chips a method is widely spread in practical use in which the end of a solder wire is brought into contact with the substrate that his heated over the melting temperature of the solder in order to melt down a piece of the wire. This method is generally well suited for mass production due to its simplicity and flexibility. However, the obtained approximately circular wetting surface is badly adapted to the rectangular or square shape of the semiconductor chips. A punching die is further known from U.S. Pat. No. 6,056,184 with which the portion of solder deposited on the substrate can be brought into a flat shape which is adjusted to the rectangular shape of the semiconductor chips. It is also known to move the end of the soldering metal wire with a writing head along a specific path, with the heated substrate continuously melting down the solder. A track of solder is thereby deposited on the substrate.

From U.S. Pat. No. 5,878,939 a method is known in which liquid solder is injected into a cavity formed between a molding die and the substrate.

These known methods come with a number of disadvantages. The shape of the deposited solder is either round or a specific punching die needs to be produced for every rectangular shape. Such a punching die comprises side walls which cover a part of the substrate. The solder can therefore not be applied up to the edge of the chip island which accommodates the semiconductor chip. Moreover, the substrate needs to be heated up over the melting temperature of the solder and the deposited solder needs to be kept in liquid form from the application until the placement of the semiconductor chip. It is also disadvantageous that the parts that come into contact with the liquid solder need to be cleaned regularly, for which purpose production needs to be interrupted.

From U.S. Pat. No. 4,577,398 and U.S. Pat. No. 4,709,849 a method is known in which flat preforms made of soldering metal (so-called "solder preforms") are prefabricated, the dimensions of which are adjusted to the semiconductor chips. The solder preforms are then placed on the substrate and molten down by the same in order to form a soldering layer in the required dimensions. This method is relatively expensive and offers little flexibility due to the required prefabrication of the solder preforms and the additional mounting operations.

From US 2009145950 a method and apparatus are known in which a solder wire is guided through the writing head of a solder dispenser, with the wire being brought into contact with the heated substrate when applying the solder, so that the solder will melt at the end of the wire, and with the writing head being moved along a predetermined path parallel to the surface of the substrate. The solder dispenser writes a solder track in this manner on the substrate. It is disadvantageous in this method that the substrate can only be wetted insufficiently without preceding cleaning.

SUMMARY OF THE INVENTION

The invention is based on the object of developing a method for the application of solder to a substrate which no longer shows the mentioned disadvantages.

A method for dispensing solder on a substrate according to the invention comprises the following steps:
A) heating a substrate to a temperature which lies above a melting temperature of the solder;
B) dispensing at least one solder portion on a surface of the substrate;
C) lowering a pin into the solder portion until the pin touches the surface of the substrate;
D) applying a predetermined force to the pin, so that the pin presses against the substrate;
E) applying ultrasonic sound to the pin in such a way that ultrasonic waves are produced in the pin which are directed perpendicularly or angularly in relation to the surface of the substrate;
F) moving the pin along a predetermined path which extends parallel to said surface of the substrate, and
G) lifting the pin until the pin has been severed from the solder portion.

Preferably, the method further comprises cooling the pin to a temperature which is at least 10 K lower than the melting temperature of the solder and which lies above a solidus temperature of the solder.

Alternatively, the method further comprises holding the substrate at a temperature during the steps C to F which is at least 10 K lower than the melting temperature of the solder and which lies above a solidus temperature of the solder.

If in step B the solder is dispensed on a substrate place then said moving the pin along a predetermined path preferably includes moving the pin at least partly along an edge of the substrate place, with a contact surface of the pin protruding beyond the substrate place and thereby touching the substrate place only partly.

In the case a single solder portion is dispensed on the substrate place, a diameter of the pin is smaller than a mean diameter of the solder portion.

A method for mounting semiconductor chips on a substrate comprises additionally to the above mentioned steps of dispensing a solder portion on the substrate placing a semiconductor chip on the solder portion.

BRIEF DESCRIPTION OF THE DRAWING FIGURES

Figure 4A:
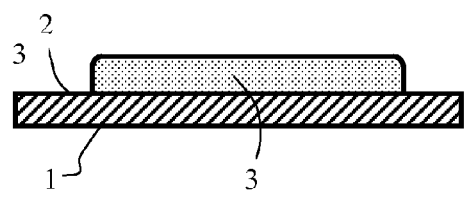
Figure 4B:
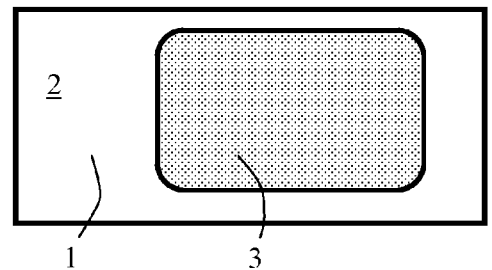
Figure 5:
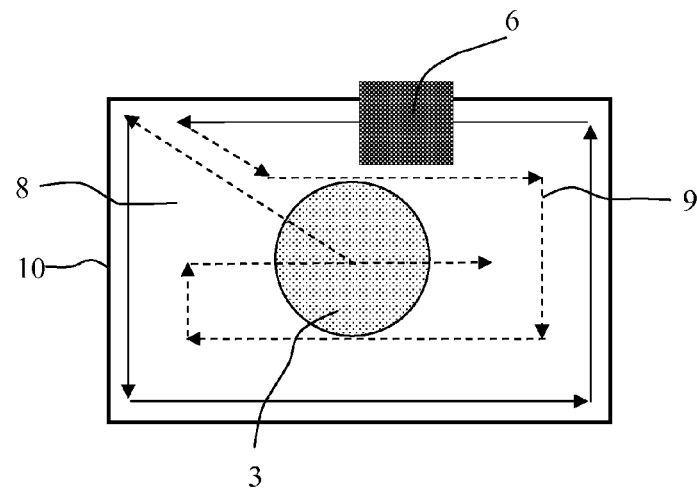

The accompanying drawings, which are incorporated into and constitute a part of this specification, illustrate one or more embodiments of the present invention and, together with the detailed description, serve to explain the principles and implementations of the invention. The figures are not to scale. In the drawings:

FIGS. 1-4 illustrate the method in accordance with the invention for applying solder to a substrate, and FIG. 5 illustrates a special embodiment of the method in accordance with the invention.

DETAILED DESCRIPTION OF THE INVENTION

Semiconductor chips need to be soldered onto a substrate in practice, the edge dimensions of which reach from the submillimeter range up to the centimeter range. The method in accordance with the invention is therefore implemented in a manner optimally adjusted to the size of the semiconductor chips and the connection quality required by the application. The mounting of the semiconductor chips occurs by means of an automatic assembly machine known as a soft solder die bonder. The substrates are supplied in a cyclic manner to a dispensing station where solder is applied to the substrate and thereafter to a bonding station where the semiconductor chip is placed on the solder portion. The substrate is held for these two processes at a temperature which lies above the melting temperature of the solder and usually under an inert gas atmosphere.

FIGS. 1 to 4 illustrate the method in accordance with the invention for applying solder to a substrate 1 based on the example that subsequently a semiconductor chip of medium or large size will be placed on the solder. The method comprises the following steps:

A) Heating of the substrate 1 to a temperature which lies above the melting temperature of the solder.

B) Dispensing at least one solder portion 3 to the substrate 1.

This step occurs in the known manner. The state after this step is shown in FIG. 1A (lateral view) and FIG. 1B (view from above).

Figure 2:
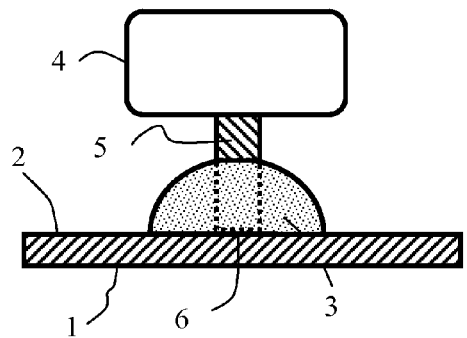

C) Lowering and immersing a pin 5 into the solder, with the diameter of the pin 5 being smaller than the mean diameter D of the soldering portion 3. The pin 5 will be lowered until a contact surface 6 of the pin 5 touches the substrate 1 and a force is applied, so that the pin 5 presses against substrate 1. The state after this step is shown in FIG. 2.

The pin 5 is fastened to a head 4, with the head 4 being liftable and lowerable and movable parallel to the surface 2 of the substrate 1 on the one hand and with the head 4 configured on the other hand to apply ultrasonic sound to the pin 5 in such a way that in the pin 5 ultrasonic waves are produced which are usually directed perpendicularly to the surface 2 of the substrate 1.

D) Applying ultrasonic sound to the pin 5.

E) Moving the pin 5 along a predetermined path extending parallel to the surface 2 of substrate 1.

Figure 3:
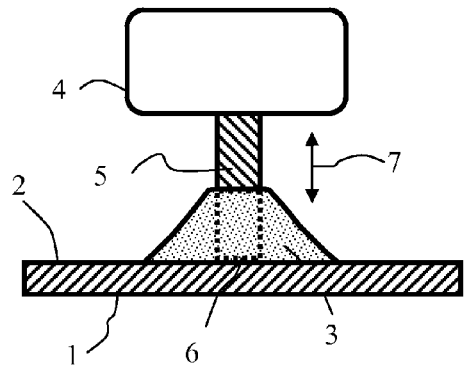

FIG. 3 illustrates this method step. The direction of the oscillations produced by the ultrasonic waves in the pin 5 is indicated by an arrow 7. The ultrasonic sound will be transmitted by the pin 5 onto the substrate 1 and causes by cavitation a destruction and removal of any oxide layers which were formed on the surface 2 of the substrate and thereby improves the wettability of the surface which should be covered by the solder. While the pin 5 is moved along the predetermined path, the surface 2 of substrate 1 will be cleaned locally as mentioned and the wettability of the surface 2 on the area to be coated with the solder will be improved on the one hand and the solder is distributed on this area on the other hand.

F) Lifting of the pin 5 until it has been separated from the solder portion 3.

The state after this step is shown in FIG. 4A (lateral view) and 4B (view from above). The solder portion 3 has now been evenly distributed over the desired area.

The steps C) and D) can be exchanged. The application of ultrasonic sound to the pin 5 can be terminated before or after the step F).

The ultrasonic waves generated by the described method in the pin 5 are longitudinal ultrasonic waves with respect to the longitudinal axis of the pin 5 extending perpendicularly to the surface 2 of the substrate 1. The frequency of the ultrasonic waves preferably lies in the range from 40 kHz to 200 kHz, typically at approximately 60 kHz. The processing of the substrate 1 with ultrasonic sound improves the wettability locally on the area on which the solder is desired and thereby reduces the undesirable bleeding of the solder which is known in the field as "solder bleed out".

The pin 5 is preferably oriented perpendicularly to the surface 2 of the subject 1; it can also be oriented in an angular manner, i.e. under a predetermined angle, in relation to the surface 2 of the substrate 1. The ultrasonic waves are therefore oriented mainly perpendicularly or at least angularly in relation to the surface 2 of the substrate 1.

It is possible to vary the strength and the frequency of the ultrasonic waves according to a predetermined profile; in particular, individual or several ultrasonic bursts can be used.

The head 4 can be gimbal-mounted and/or or held in a resilient manner, so that any unevenness or tilt of the substrate 1 can be compensated. The force with which the pin 5 is pressed against the substrate 1 is comparatively low because the power required for the ultrasonic waves increases with increasing force. The force can be produced for example by resilient bearing of the pin 5 on the head 4.

Once the solder portion 3 has been applied to the substrate 1, the substrate 1 will be transported to the bonding station where a semiconductor chip will be placed on the solder portion 3.

Research by the inventor has shown that it is advantageous in certain solders when the temperature of the solder lies beneath its melting temperature during processing with the pin 5. This applies especially to solders which have a low viscosity at their melting temperature, which leads to the consequence that splashes can be produced during the distribution of the solder on the substrate. It is therefore advantageous to increase the viscosity in such solders. In this case, the method in accordance with the invention is advantageously modified according to one of the following variants:

Variant 1

After step B and before step C: Lowering of the temperature of the substrate 1 to a level which lies at least a few Kelvin, e.g. 10 K, typically at least 20 to 30 K or more, beneath the melting temperature, but above the solidus temperature of the solder.

The temperature of the substrate 1 can be increased again to a temperature above the melting temperature of the solder after step E or after step F in order to thereafter apply the semiconductor chip in the bonding station.

Variant 2

Cooling of the pin 5 to a temperature which lies at least a few Kelvin, e.g. 10 K, typically at least 20 to 30 K or more, beneath the melting temperature, but above the solidus temperature of the solder.

The cooling of the pin 5 ensures that the pin 5 removes heat from the solder portion 3 during the steps C to E, so that the temperature of the solder portion 3 decreases at least locally in the environment of the pin 5 and thereby increases its viscosity. This is the case although the substrate 1 is held at a higher temperature which lies in the range of the melting temperature of the solder.

In numerous applications, a semiconductor chip is mounted on a substrate place 8, the dimensions of which are approximately same as the dimensions of the semiconductor chip. The substrate is typically a so-called leadframe. The substrate place 8 is connected via thin webs (not shown) with the frame of the leadframe. It is mostly the case that the solder portion needs to cover the entire substrate place 8. For this purpose it is advantageous to move the pin 5 along a path 9 which leads at least partly along the edge 10 of the substrate place 8 and is set in such a way that the contact surface 6 of the pin 5 protrudes beyond the edge 10 and therefore only partly touches the substrate place 8. This is illustrated in FIG. 5. The parts of the path 9 in which the contact surface 6 of the pin 5 protrudes beyond the edge 10 are shown by way of solid arrows and the remaining parts of the path 9 by dashed arrows. In this example, the path 9 leads at first from the center of the solder portion 3 to a corner of the substrate place 8, then along the edge 10 of the substrate place 8 and then along path sections disposed in the interior of the substrate place 8. The sequence of the individual path sections can also be chosen differently. The path 9 is only shown by way of example here; it can also be composed of other path sections. The contact area 6 of the pin 5 is square in this example, but it can also be rectangular or round or have any other desired shape.

When mounting relatively large semiconductor chips and it may be advantageous to dispense several solder portions to the substrate and to distribute them thereafter with the pin. In this case, the diameter of the pin 5 may also be larger than the mean diameter of an individual solder portion.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

What is claimed is:

1. A method for dispensing solder on a substrate, the method in sequence comprising:
   A) heating a substrate to a temperature which lies above a melting temperature of the solder;
   B) dispensing at least one solder portion on a surface of the substrate;
   C) after dispensing the at least one solder portion, contacting and lowering a pin into the solder portion until the pin touches the surface of the substrate;
   D) applying a predetermined force to the pin, so that the pin presses against the substrate;
   E) applying ultrasonic sound to the pin in such a way that ultrasonic waves are produced in the pin which are directed perpendicularly or angularly in relation to the surface of the substrate;
   F) moving the pin along a predetermined path which extends parallel to said surface of the substrate, wherein during the moving the pin is located in the solder and ultrasonic sound is applied to the pin;
   G) terminating the application of ultrasonic sound to the pin after the moving; and then
   H) lifting the pin until the pin has been severed from the solder portion.

2. The method according to claim 1, wherein said moving the pin along a predetermined path comprises cooling the pin to a temperature which is at least 10 K lower than the melting temperature of the solder and which lies above a solidus temperature of the solder.

3. The method according to claim 1, further comprising holding the substrate at a temperature during the steps C to F which is at least 10 K lower than the melting temperature of the solder and which lies above a solidus temperature of the solder.

4. The method according to claim 1, wherein in step B the solder is dispensed on a substrate place and wherein said moving the pin along a predetermined path includes moving the pin at least partly along an edge of the substrate place, with a contact surface of the pin protruding beyond the substrate place and thereby touching the substrate place only partly.

5. The method according to claim 2, wherein in step B the solder is dispensed on a substrate place and wherein said moving the pin along a predetermined path includes moving the pin at least partly along an edge of the substrate place, with a contact surface of the pin protruding beyond the substrate place and thereby touching the substrate place only partly.

6. The method according to claim 3, wherein in step B the solder is dispensed on a substrate place and wherein said moving the pin along a predetermined path includes moving the pin at least partly along an edge of the substrate place, with a contact surface of the pin protruding beyond the substrate place and thereby touching the substrate place only partly.

7. The method according to claim 1, wherein in the case of a single solder portion a diameter of the pin is smaller than a mean diameter of the solder portion.

8. The method according to claim 2, wherein in the case of a single solder portion a diameter of the pin is smaller than a mean diameter of the solder portion.

9. A method for mounting semiconductor chips on a substrate, the method in sequence comprising:
   A) heating a substrate to a temperature which lies above a melting temperature of the solder;
   B) dispensing at least one solder portion on a surface of the substrate;
   C) after dispensing the at least one solder portion, contacting and lowering a pin into the solder portion until the pin touches the surface of the substrate;
   D) applying a predetermined force to the pin, so that the pin presses against the substrate;
   E) applying ultrasonic sound to the pin in such a way that ultrasonic waves are produced in the pin which are directed perpendicularly or angularly in relation to the surface of the substrate;
   F) moving the pin along a predetermined path which extends parallel to said surface of the substrate, wherein during the moving the pin is located in the solder and ultrasonic sound is applied to the pin;
   G) terminating the application of ultrasonic sound to the pin after the moving; and then
   H) lifting the pin until the pin has been severed from the solder portion, and
   I) placing a semiconductor chip on the solder portion.

10. The method according to claim 9, wherein said moving the pin along a predetermined path comprises cooling the pin to a temperature which is at least 10 K lower than the melting temperature of the solder and which lies above a solidus temperature of the solder.

11. The method according to claim 9, further comprising holding the substrate at a temperature during the steps C to F which is at least 10 K lower than the melting temperature of the solder and which lies above a solidus temperature of the solder.

12. The method according to claim 9, wherein in step B the solder is dispensed on a substrate place and wherein said moving the pin along a predetermined path includes moving the pin at least partly along an edge of the substrate place, with a contact surface of the pin protruding beyond the substrate place and thereby touching the substrate place only partly.

13. The method according to claim 10, wherein in step B the solder is dispensed on a substrate place and wherein said moving the pin along a predetermined path includes moving the pin at least partly along an edge of the substrate place, with a contact surface of the pin protruding beyond the substrate place and thereby touching the substrate place only partly.

14. The method according to claim 11, wherein in step B the solder is dispensed on a substrate place and wherein said moving the pin along a predetermined path includes moving the pin at least partly along an edge of the substrate place, with a contact surface of the pin protruding beyond the substrate place and thereby touching the substrate place only partly.

15. The method according to claim 9, wherein in the case of a single solder portion a diameter of the pin is smaller than a mean diameter of the solder portion.

16. The method according to claim 10, wherein in the case of a single solder portion a diameter of the pin is smaller than a mean diameter of the solder portion.

17. The method according to claim 11, wherein in the case of a single solder portion a diameter of the pin is smaller than a mean diameter of the solder portion.

18. The method according to claim 12, wherein in the case of a single solder portion a diameter of the pin is smaller than a mean diameter of the solder portion.

19. The method according to claim 13, wherein in the case of a single solder portion a diameter of the pin is smaller than a mean diameter of the solder portion.

20. The method according to claim 14, wherein in the case of a single solder portion a diameter of the pin is smaller than a mean diameter of the solder portion.

* * * * *